United States Patent
Tamaki et al.

(10) Patent No.: US 12,284,763 B2
(45) Date of Patent: Apr. 22, 2025

(54) PRINTED CIRCUIT BOARD AND METHOD FOR MANUFACTURING THE SAME

(71) Applicant: Sony Interactive Entertainment Inc., Tokyo (JP)

(72) Inventors: Yuta Tamaki, Tokyo (JP); Kazutaka Eto, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 155 days.

(21) Appl. No.: 17/594,855

(22) PCT Filed: May 21, 2020

(86) PCT No.: PCT/JP2020/020162
§ 371 (c)(1),
(2) Date: Nov. 1, 2021

(87) PCT Pub. No.: WO2020/235645
PCT Pub. Date: Nov. 26, 2020

(65) Prior Publication Data
US 2022/0312658 A1    Sep. 29, 2022

(30) Foreign Application Priority Data

May 23, 2019  (JP) ................................ 2019-096801

(51) Int. Cl.
*H05K 13/00* (2006.01)
*H05K 13/04* (2006.01)
*H05K 13/08* (2006.01)

(52) U.S. Cl.
CPC ....... *H05K 13/046* (2013.01); *H05K 13/0813* (2018.08)

(58) Field of Classification Search
CPC ............... H05K 13/046; H05K 13/081; H05K 13/0813; H05K 1/02
See application file for complete search history.

(56) References Cited

U.S. PATENT DOCUMENTS 6,429,383 B1 * 8/2002 Sprietsma .............. H05K 1/113
29/852
6,784,377 B2 * 8/2004 Chamberlin ......... H05K 3/4046
174/265

(Continued)

FOREIGN PATENT DOCUMENTS

JP  53146055 U   11/1978
JP  56-078570 U1  6/1981

(Continued)

OTHER PUBLICATIONS

International Search Report for corresponding PCT Application PCT/JP2020/020162, 2 pages, dated Aug. 18, 2020.

(Continued)

*Primary Examiner* — Paul D Kim
(74) *Attorney, Agent, or Firm* — Kilpatrick Townsend & Stockton LLP

(57) ABSTRACT

A main printed circuit board of electronic equipment includes through-holes and into which a plurality of types of components are attached. Lands are respectively provided around the through-holes and to electrically connect the components to a main printed circuit board. Shapes of the lands correspond to shapes of components attached to the through-holes. For example, in automatic mounting of components, the shapes of the lands are determined by image recognition, and components with shapes corresponding to the shapes of the lands are attached.

3 Claims, 14 Drawing Sheets

(56) References Cited

U.S. PATENT DOCUMENTS

| | | | |
|---|---|---|---|
| 8,971,035 B2 | 3/2015 | Tamaki | |
| 2010/0254080 A1 | 10/2010 | Tamaki | |
| 2014/0119637 A1* | 5/2014 | Nava | G06T 7/0006 |
| | | | 29/745 |
| 2018/0054884 A1* | 2/2018 | Saito | H01L 23/12 |
| 2019/0191540 A1* | 6/2019 | Boaron | H05K 3/3494 |

FOREIGN PATENT DOCUMENTS

| | | |
|---|---|---|
| JP | 57183768 U | 11/1982 |
| JP | 63-073592 A | 4/1988 |
| JP | 02035000 A | 5/1990 |
| JP | 10-200225 A | 7/1998 |
| JP | 2010244214 A | 10/2010 |
| JP | 2016207729 A | 12/2016 |

OTHER PUBLICATIONS

Decision to Grant a Patent for corresponding JP Application No. 2021-520853, 4 pages, dated Apr. 17, 2023.
Notice of Reasons for Refusal for corresponding JP Application No. 2021-520853, 5 pages, dated Oct. 25, 2022.

* cited by examiner

US 12,284,763 B2

PRINTED CIRCUIT BOARD AND METHOD FOR MANUFACTURING THE SAME

TECHNICAL FIELD

The present invention relates to a printed circuit board and a method for manufacturing electronic equipment incorporating the printed circuit board.

BACKGROUND ART

Some pieces of electronic equipment such as game apparatuses and personal computers are configured such that option equipment can be attached to the electronic equipment in order to improve performance or to expand functions. (See PTL 1)

PATENT LITERATURE

[PTL 1] Japanese Patent Laid-open No. 2010-244214

Summary Technical Problems

A plurality of electronic components, a plurality of fastening members, and the like are disposed on a printed circuit board, the electronic components are required to activate electronic equipment, and the fastening members are used to fix the printed circuit board and other components in the electronic equipment. Reduced sizes of the electronic components have led to an increased component density inside the electronic equipment and reduced sizes of components attached to the printed circuit board.

In general, the components attached onto the printed circuit board are attached using, as landmarks, symbols provided on a surface of the printed circuit board. Printing the symbols can be performed on the board surface, but a simpler formation method is to peel off insulating coating (resist) applied to the board surface. However, due to a recently reduced board area, blank regions on the printed circuit board are reduced, leading to difficulty in providing symbols on the board surface.

In view of the above-described problem, an object of the present invention is to provide a printed circuit board allowing components to be attached to corresponding portions of the printed circuit board to be easily identified without provision of special symbols.

Solution to Problems

To solve the above problems, a printed circuit board according to the present invention is a printed circuit board including through-holes into which a plurality of types of components are attached, in which regions are provided around the through-holes to electrically connect the components to the printed circuit board, and a shape of each of the regions is similar to an appearance of the component attached to corresponding one of the through-holes. In this regard, the "similarity to the appearance of the component" refers to geometric similarity between the shape of the regions and a shape resulting from projection of the component, for example, on a plane in a certain direction.

Additionally, a method for manufacturing electronic equipment according to the present invention includes the steps of capturing an image of the above-described printed circuit board using a camera, recognizing a shape of an electrical connection region in the captured image, determining, from the shape of the electrical connection region, a component to be mounted, and mounting the determined component.

DESCRIPTION OF EMBODIMENT

Electronic equipment according to an embodiment will be described. The electronic equipment can be applied to, for example, a game machine, a development machine for executing various programs being developed (for example, game programs), and an information processing apparatus other than games (for example, server apparatus).

Figure 1:
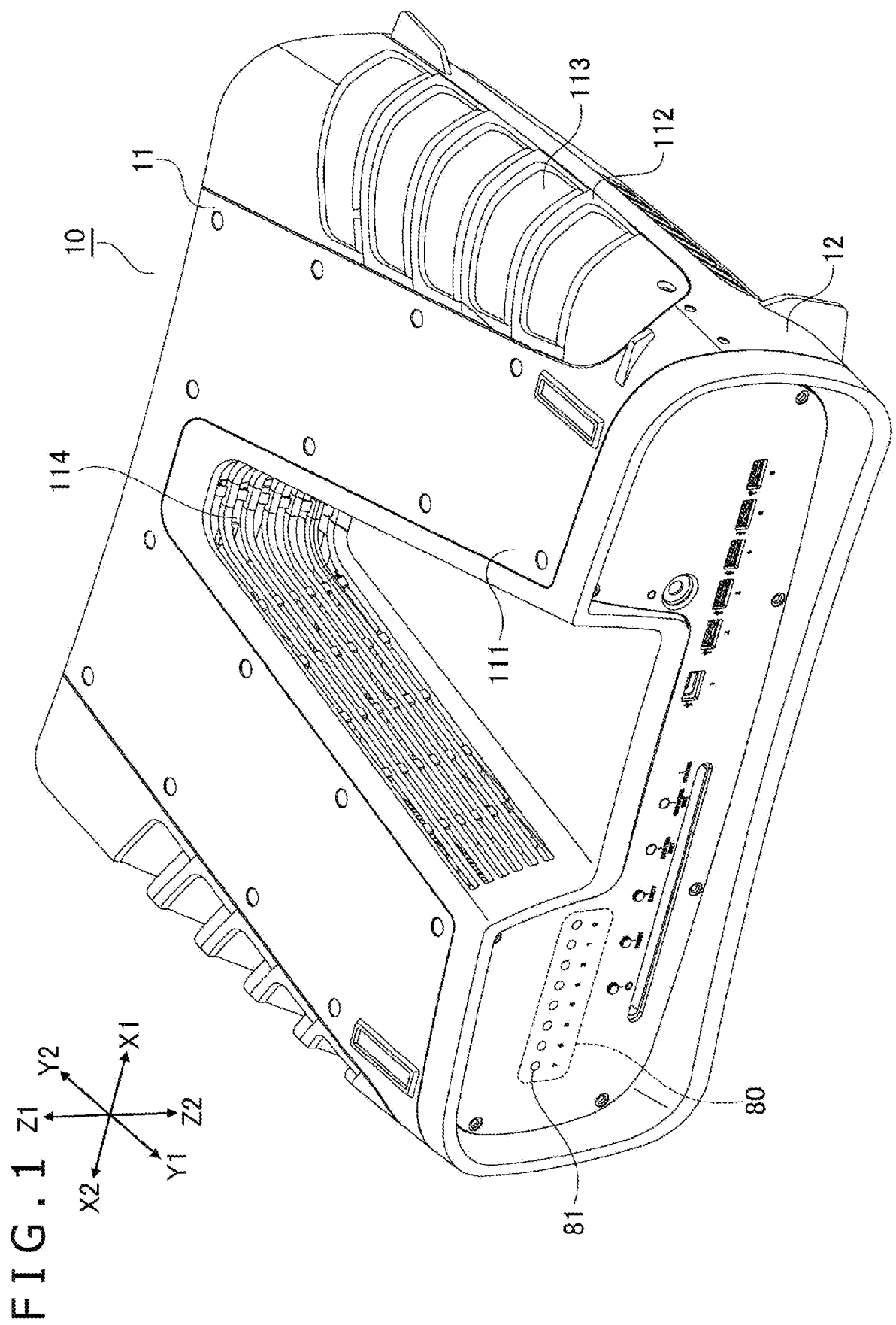
FIG. 1 is a perspective view of electronic equipment according to the present embodiment.

FIG. 1 is a perspective view of the electronic equipment according to the present embodiment. Directions labeled X1 and X2 in FIG. 1 are hereinafter respectively referred to as rightward and leftward directions, and directions labeled Y1 and Y2 in FIG. 1 are hereinafter respectively referred to as forward and rearward directions. Additionally, directions labeled Z1 and Z2 are hereinafter referred to as upward and downward directions. These directions are used to describe relative positional relations among elements (components, members, and portions) of electronic equipment 10 and are not intended to specify the orientations of the elements while the electronic equipment 10 is in use. For example, the electronic equipment 10 may be used in a horizontal orientation depicted in FIG. 1 or in a vertical orientation depicted. Additionally, the electronic equipment 10 may be configured such that the electronic equipment 10 can be used in an orientation opposite to the orientation depicted in FIG. 1.

While the electronic equipment 10 is in use, input devices such as a game controller and a keyboard, a display, and the like are connected to the electronic equipment 10. The electronic equipment 10 loads a game program recorded in an optical disc and a game program acquired via a network. The electronic equipment 10 executes a game program on the basis of signals input from the input device, and displays game images as processing results.

The electronic equipment 10 includes a main printed circuit board 40 (see FIG. 5) on which integrated circuits such as a CPU (Central Processing Unit), a GPU (Graphics Processing Unit), and a RAM (Random Access Memory) are mounted. The main printed circuit board 40 is disposed in a horizontal direction, that is, parallel to a forward-rearward direction and a lateral direction. As depicted in an exploded perspective view in FIG. 5 and in a cross-sectional view in FIG. 13, an upper side and a lower side of the main printed circuit board 40 are covered with shields of metal plates for suppressing unwanted radiation, that is, a first shield 71A, a second shield 71B, and a shield member 60.

Figure 13:
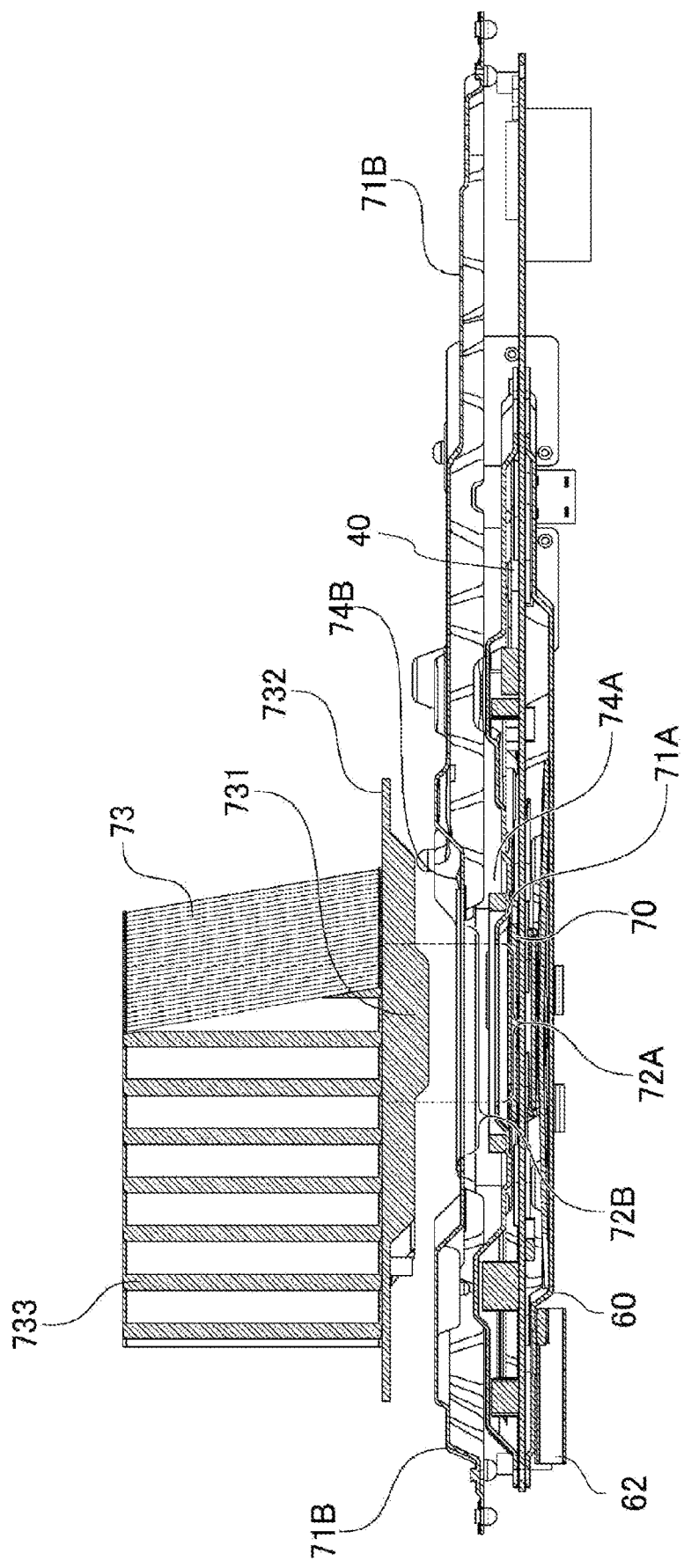
FIG. 13 is a cross-sectional view of the main printed circuit board to which a shield is attached in the present embodiment.
Figure 14:
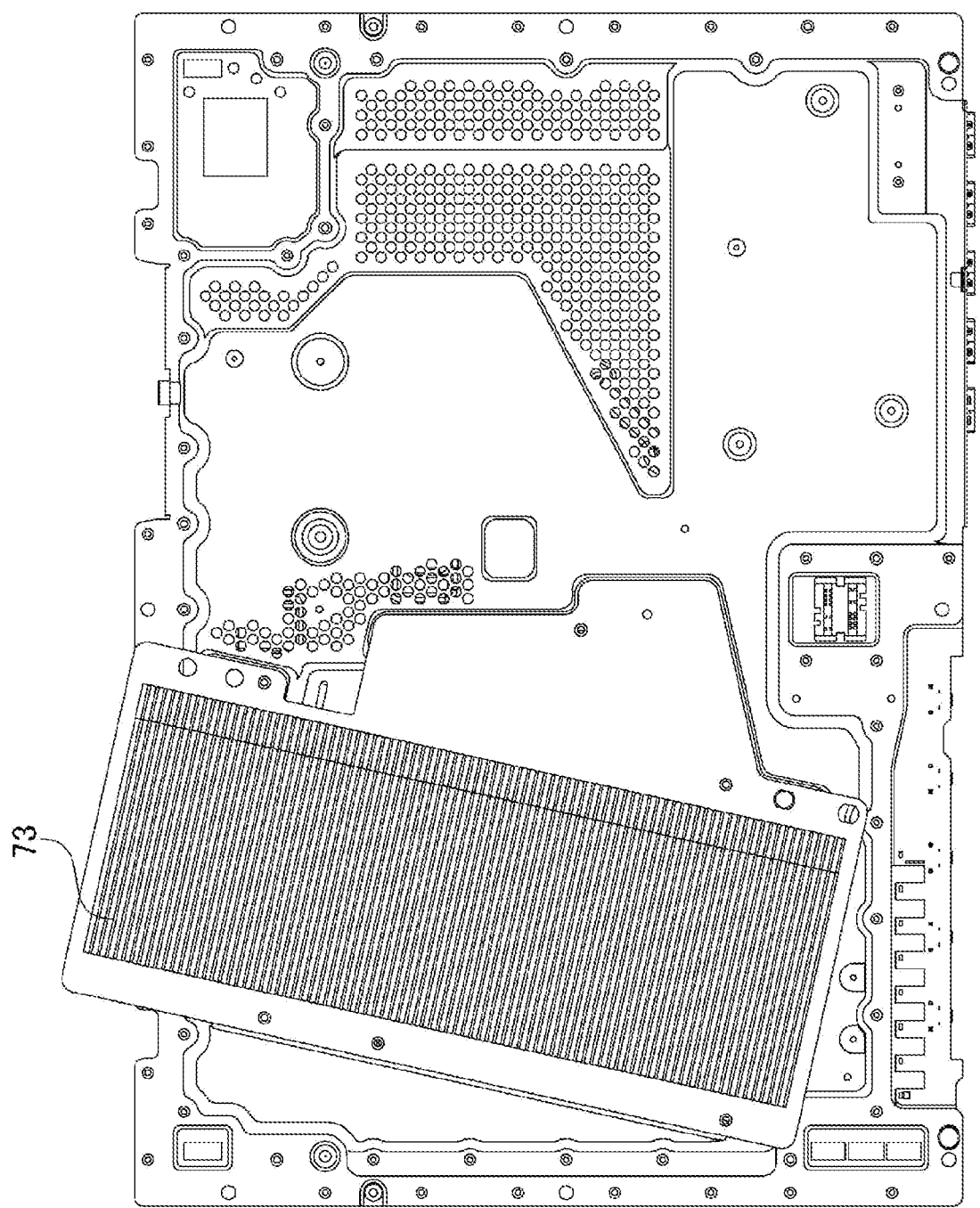
FIG. 14 is a diagram depicting the shield member according to the present embodiment with an upper cover removed, as viewed in a Z1 direction.

As depicted in top views in FIG. 13 and FIG. 14, the electronic equipment 10 includes a heat sink 73 above the main printed circuit board 40. The heat sink 73 is connected to an integrated circuit 70 corresponding to a heat source in the main printed circuit board 40. In a case where the integrated circuit 70 is a high-speed CPU, the integrated circuit 70 has high power consumption and requires a large heat sink 73. The electronic equipment 10 includes a plurality of fans for cooling, and the heat sink 73 receives airflows formed by the fans.

The heat sink 73 is disposed above the main printed circuit board 40 and includes a bottom portion 732 shaped like a plate and a plurality of fins 733 formed on the bottom portion 732. The bottom portion 732 is in contact with the integrated circuit 70. Heat from the integrated circuit 70 is transmitted from the bottom portion 732 to the fins 733.

The bottom portion 732 is a metal plate in which a vapor chamber, that is, a space with a vaporable liquid sealed therein is formed. However, the bottom portion 732 is a metal plate or a metal block including no such space. The fins 733 are welded to the bottom portion 732 and arranged in a direction along the main printed circuit board 40. For example, the fins 733 include metal plates arranged at predetermined intervals on an upper surface of the bottom portion 732 parallel to the main printed circuit board 40.

The structure of the heat sink 73 is not limited to the example in FIG. 13. For example, the bottom portion 732 and the fins 733 of the heat sink 73 may be integrally formed. Additionally, the plurality of fins 733 may be arranged in an upward-downward direction. In other words, the fins 733 may be configured such that the fins 733 are arranged in a direction perpendicular to the main printed circuit board 40.

With reference back to FIG. 1, an upper case 11 includes a main body cover 111, and a side cover 112 formed separately from the main body cover 111 and attached to the main body cover 111. The main body cover 111 is V-shaped such that a substantially triangular recess portion 114 is formed in the center of an upper surface of the electronic equipment 10. By placing the heat sink 73 along an inner wall of the recess portion 114 and providing an inlet port in the inner wall, an inlet area of a sufficient size compatible with the heat sink 73 can be provided. As a result, a large amount of air can be fed to the heat sink 73, and heat from the heat sink 73 can be efficiently discharged. Note that as long as the inner wall is formed to conform to the arrangement of the heat sink 73, the shape of the recess portion 114 is not limited to the shape illustrated. Moreover, the side cover 112 is provided with an exhaust port 113. Note that the side cover 112 may be symmetrically installed on right and left surfaces of the electronic equipment 10.

Figure 2:
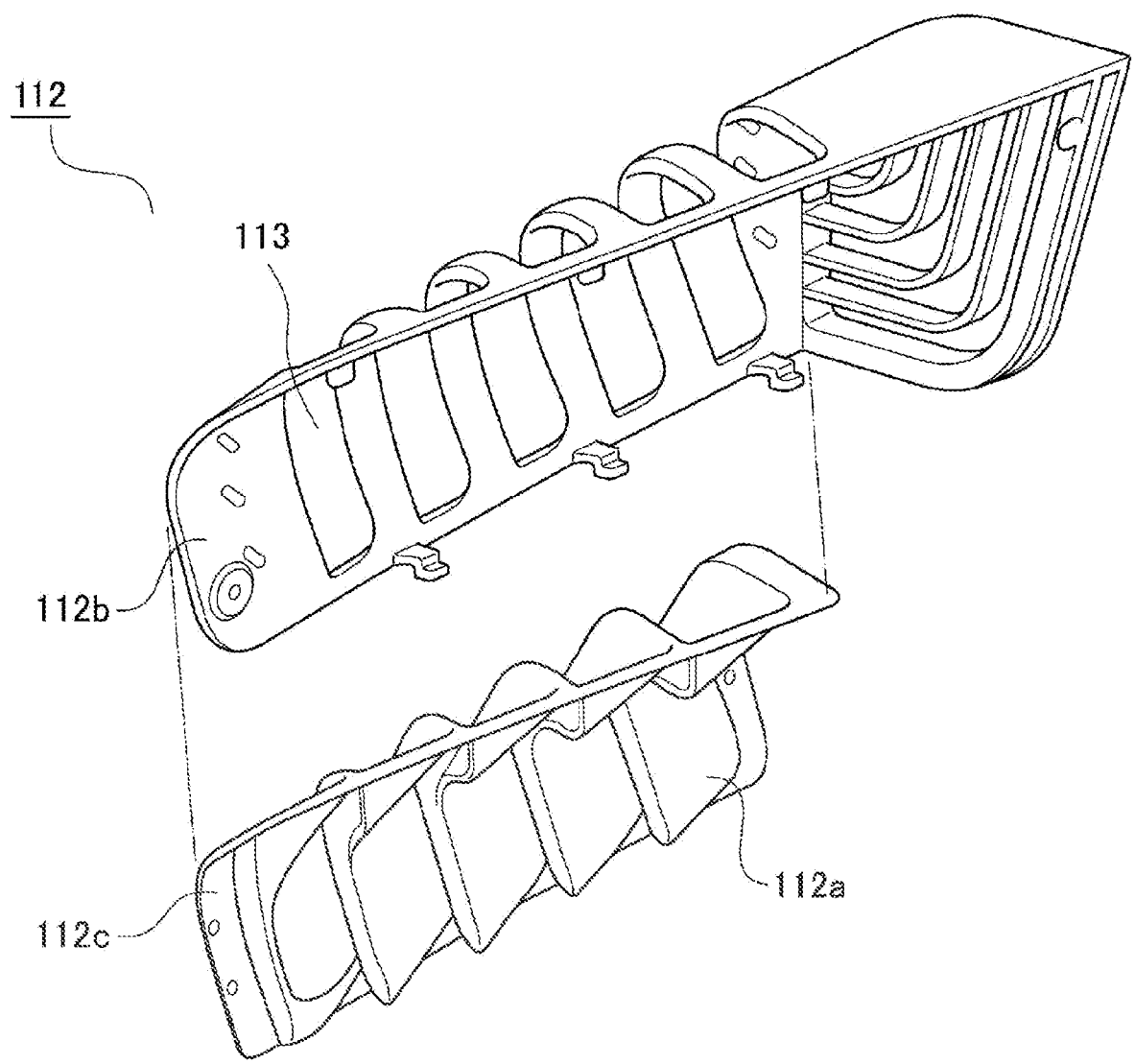
FIG. 2 is an exploded perspective view of an exhaust port provided at an upper portion of the electronic equipment according to the present embodiment.

[Structure of Louver] FIG. 2 is an exploded perspective view of the exhaust port provided at the upper portion of the electronic equipment 10. In other words, FIG. 2 depicts the internal structure of the side cover 112. As depicted in FIG. 1 and FIG. 2, a plurality of louvers 112a arranged in the forward-rearward direction are formed inside the exhaust port 113. The louvers 112a are shaped like plates and guide airflows from the inside of the electronic equipment 10 in an oblique direction toward the back of the electronic equipment 10. This causes air having passed through the heat sink 73 to be discharged to the back of the electronic equipment 10.

The side cover 112 includes an outer member 112b constituting the upper surface and the side surfaces of the electronic equipment 10 and an inner member 112c including a plurality of louvers 112a and attached to the inner side of the outer member 112b. The side cover 112 may be integrally formed using one member.

In a side view of the electronic equipment 10, each of the louvers 112a desirably partly overlap an adjacent louver 112a. This prevents the inside of the electronic equipment 10, for example, a cooling fan, from being exposed to the outside.

Figure 3:
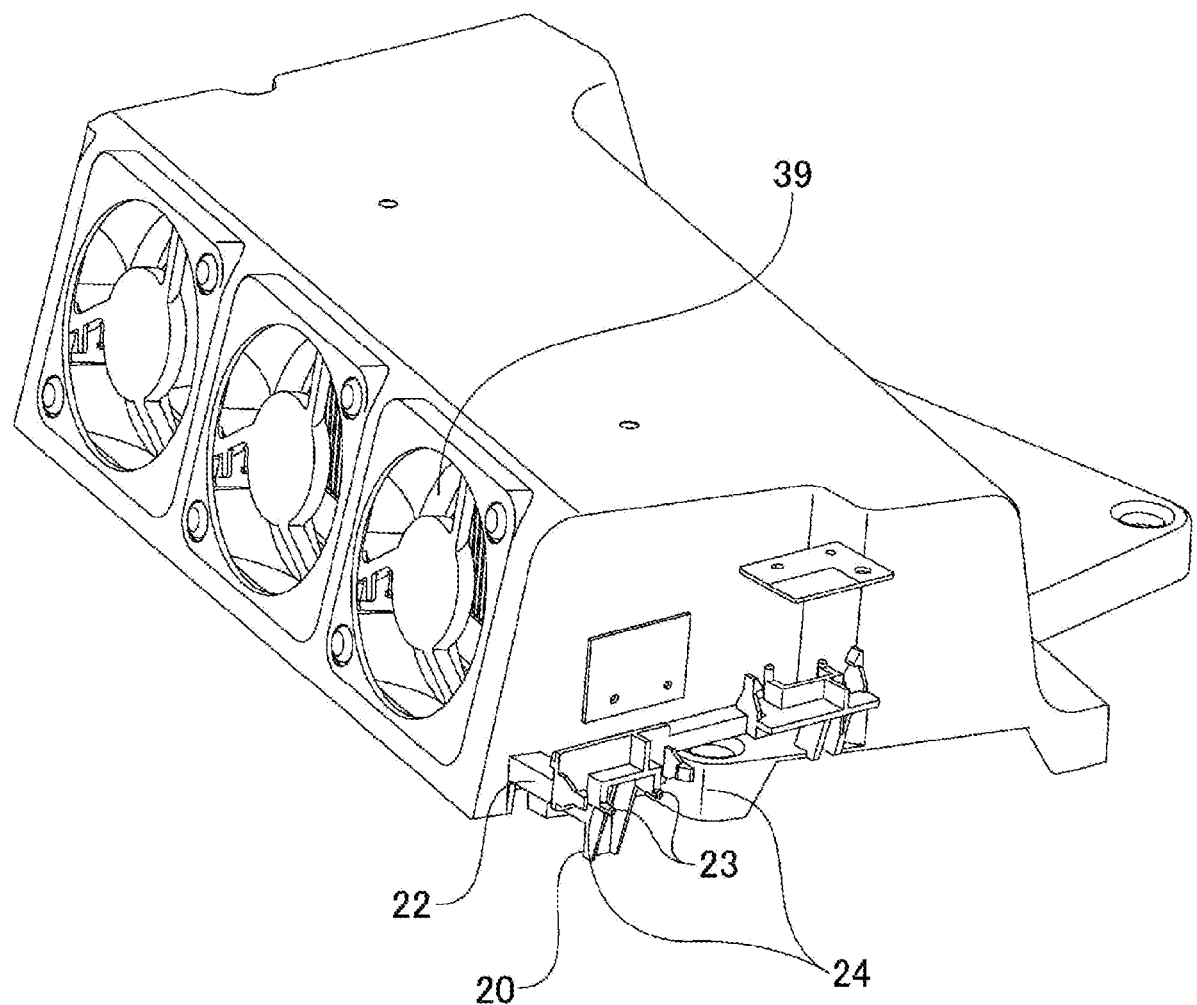
FIG. 3 is a perspective view illustrating a unit including a cooling fan and an antenna attachment member according to the present embodiment.

[Antenna Attachment Member] The electronic equipment 10 includes an antenna. FIG. 3 is a perspective view of a unit of the electronic equipment 10 including a cooling fan and an antenna attachment member. A housing of the unit includes a first structure housing a fan 39 and an antenna substrate attachment portion 20 corresponding to a second structure. The unit is built into the electronic equipment 10 such that the fan 39 is located behind the unit. The antenna substrate attachment portion 20 is formed at a tip of a support portion 22 extending from a corner of the housing.

The antenna substrate attachment portion 20 includes a fitting portion 23 for positioning the antenna substrate and a holding portion 24 holding the antenna substrate. When the antenna substrate is attached to the antenna substrate attachment portion 20, the fitting portion 23 fits into a hole provided on the antenna substrate to position the antenna substrate.

When the antenna substrate attachment portion 20 is seen in front view, the portions such as the fitting portion 23 and the holding portion 24 which constitute the antenna substrate attachment portion 20 include no overlapping portions. In other words, the electronic equipment 10 is not configured such that, when the electronic equipment 10 is viewed from the tip side of the support portion 22, a component of the antenna substrate attachment portion 20, corresponding to the second structure, is located behind another component of the antenna substrate attachment portion 20. This shape allows the first and second structures to be integrally molded, improving productivity.

Figure 4:
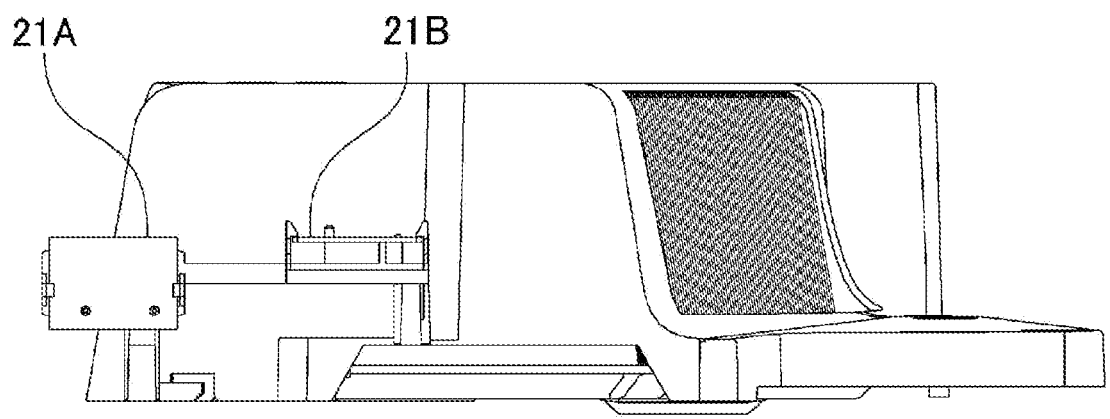
FIG. 4 is a side view of the unit in a case where an antenna substrate is attached to the antenna attachment member according to the present embodiment.

FIG. 4 is a side view of the unit in a case where the antenna attachment member is attached to the antenna substrate. The unit is provided with a plurality of antenna substrate attachment portions 20 to allow the antenna substrate to be attached at different angles. In the illustrated example, the antenna substrates 21A and 21B are installed at angles differing from each other by 90 degrees. Specifically, with respect to the electronic equipment 10, the substrate surface of the antenna substrate 21A extends in the vertical direction, while the substrate surface of the antenna substrate 21B extends in the horizontal direction. The number of antenna substrates may be three or more. Varying the orientations (angles) of the antenna substrates enables wider range of transmission and reception of radio waves.

Figure 5:
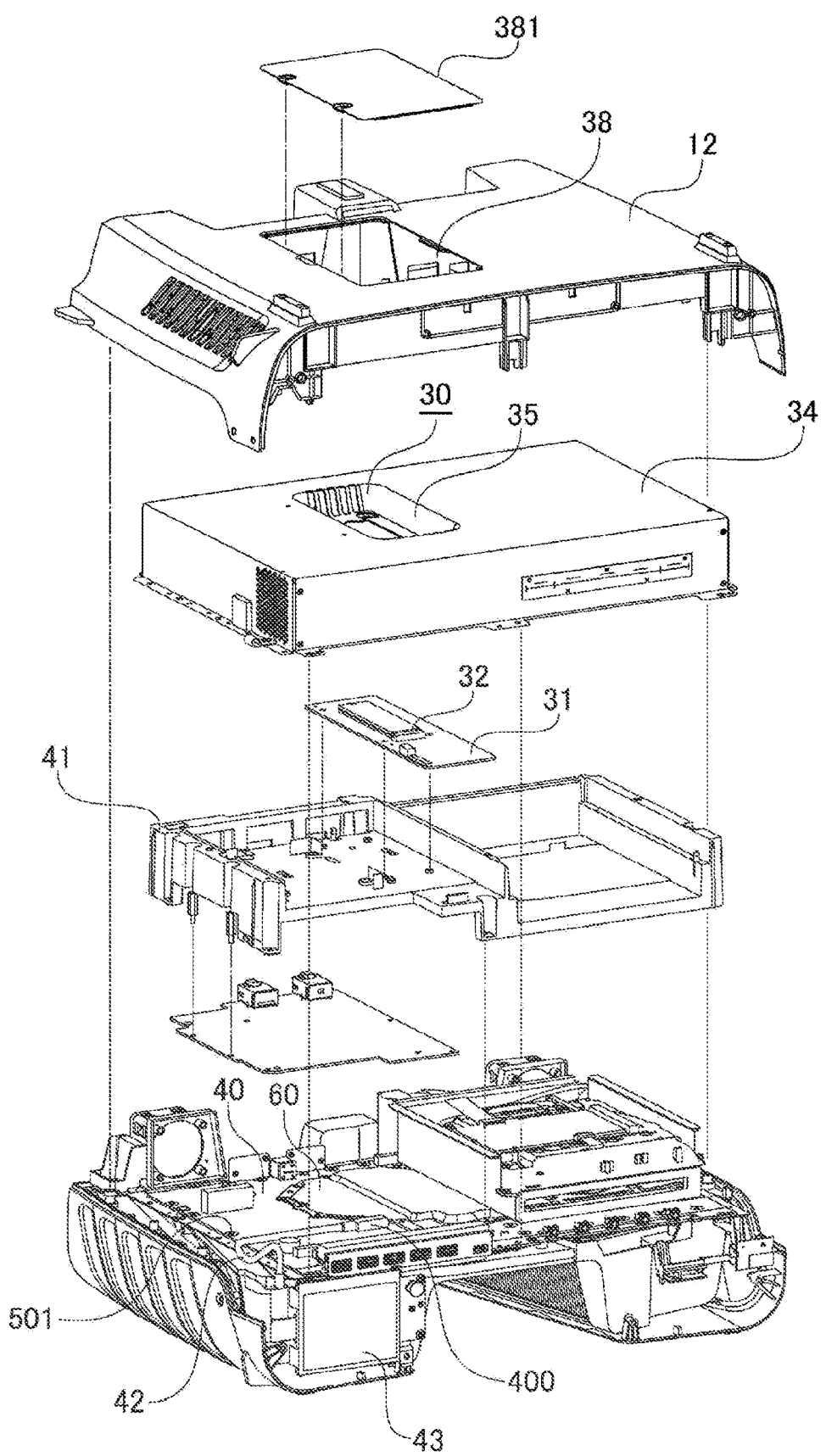
FIG. 5 is an exploded perspective view of the electronic equipment, in which an upward direction corresponds to a Z2 direction depicted in FIG. 1.

[Option Equipment Attachment Portion] FIG. 5 is an exploded perspective view of the electronic equipment in which the upward direction corresponds to the Z2 direction in FIG. 1. The option equipment attachment portion 30 is provided in a bottom surface of the electronic equipment 10. The option equipment attachment portion 30 includes an option printed circuit board 31 and a connector 32 used to attach option equipment (not illustrated). Additionally, provided is a lower shield member 34 that covers a part of the main printed circuit board 40 and that suppresses electromagnetic radiation from the electronic equipment to the outside. A lower case 12 houses these structures. Note that the option printed circuit board 31 may be the same as or different from the main printed circuit board 40 and that in the latter case, the option printed circuit board 31 and the main printed circuit board 40 may be electrically connected using a connector or the like.

Figure 6:
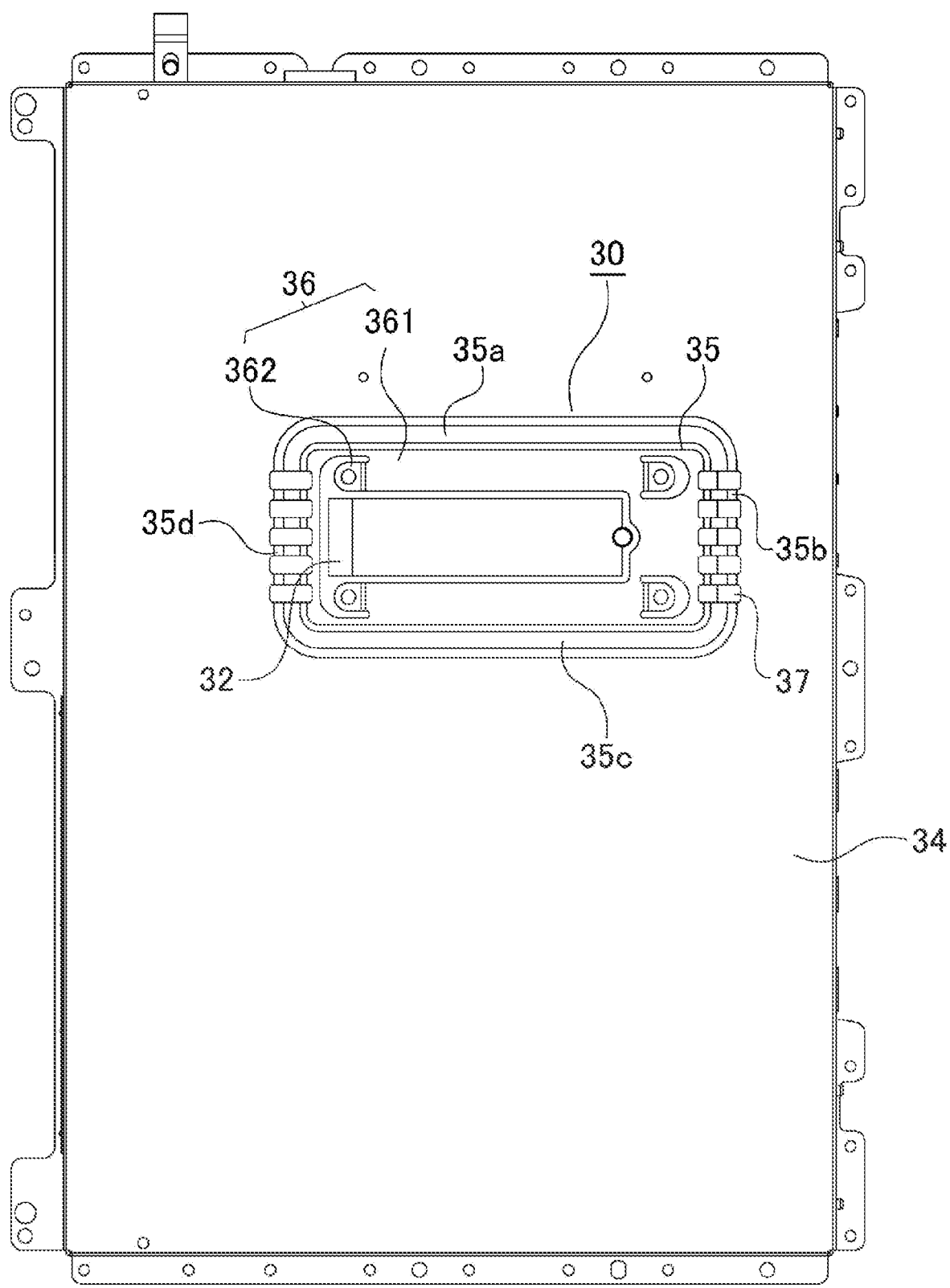
FIG. 6 is a front view of an option equipment attachment portion and a lower shield member provided on a bottom surface side of the electronic equipment according to the present embodiment.

FIG. 6 is a front view of the option equipment attachment portion 30 and the lower shield member 34 provided on the bottom surface side of the electronic equipment 10. As depicted in FIG. 6, the lower shield member 34 covers the region other than a region to which option equipment is attached. In a central portion of the lower shield member 34, a depression with a difference in level from the upper surface (upper surface in FIG. 5) is formed to house the option equipment. The depression includes a wall 35 (35a, 35b, 35c, and 35d) as an inner wall, and the wall 35 encloses the option equipment attachment portion 30.

At a bottom portion of the depression, an option equipment attachment region of the option printed circuit board 31 is exposed. Note that the option equipment attachment region need not be located in the central portion of the lower shield member 34. For example, the option equipment attachment region may be in contact with a corner portion corresponding to one of four corners of an upper surface of the lower shield member 34 or with an edge portion corresponding to a side other than the four corners. In either case, by providing, at the bottom portion of the depression of the lower shield member 34, the region where the option printed circuit board 31 is exposed, the inner wall of the depression can maintain shielding capability at the boundary between the region and the lower shield member 34.

In the illustrated example, the upper surface shape of the depression is substantially rectangular, and thus, the four walls 35a, 35b, 35c, and 35d are formed. However, the depression is not limited to this shape, and any of a circle, an ellipse, a triangle, or a pentagon or any other polygon with more angles may be used. In this case, the upper surface shape of the depression may be appropriately selected depending on the shape of expected option equipment. In this case as well, the position of the depression in the lower shield member 34 is not limited, and in either way, the inner wall of the depression can maintain the shielding capability.

At a lower portion of a pair of opposite walls (in the present embodiment, the walls 35a and 35c) included in the walls 35a, 35b, 35c, and 35d forming the depression, provided is a connection portion 36 that is used to connect the lower shield member 34 to the option printed circuit board 31. The connection portion 36 includes a base portion 361 and a fixing portion 362. The lower shield member 34 is fixed by screwing, to the option printed circuit board 31, a hole provided in the fixing portion 362. The fixing portion 362 is elastic due to at least any one of a material and a structure. For example, the fixing portion 362 is formed as an L-shaped arm to absorb misalignment of components attributed to tolerances or the like.

A plurality of vent holes 37 are formed in the pair of opposite walls 35b and 35d of the lower shield member 34. The vent hole 37 is formed such that a flow path of air taken from the outside of the housing by a fan to be described below passes over an exposed region of the option printed circuit board 31 and over the option equipment attached to the region. The plurality of vent holes 37 extend in a direction in which the vent holes 37 intersect the circuit board. Specifically, the vent holes 37 include slit-like holes formed in the inner wall of the depression and that are elongate in the upward-downward direction, the holes being arranged in the lateral direction. This allows the option equipment to be efficiently cooled.

The lower case 12 in FIG. 5 is made of resin, and includes an opening 38 corresponding to the option equipment attachment region (option equipment attachment portion 30). A cover 381 covers the opening 38 in the lower case 12. The cover 381 prevents exposure to the outside of the housing of the option equipment.

Figure 7:
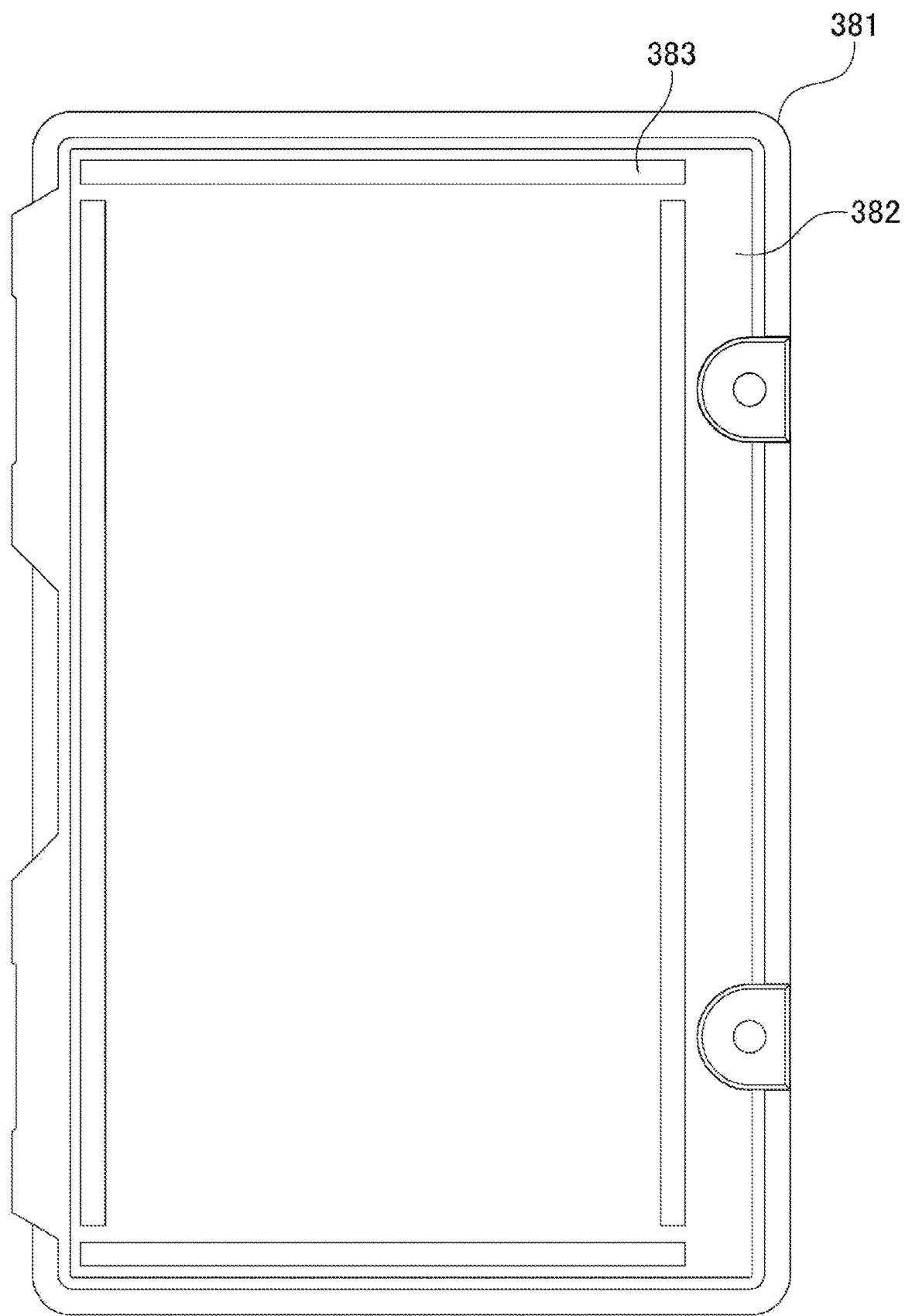
FIG. 7 is a front view of a cover portion attached to the option equipment attachment portion according to the present embodiment.

FIG. 7 is a front view of a cover portion attached to the option equipment attachment portion 30. As depicted in FIG. 7, a shield surface 382 is provided on a side of the cover 381 facing the printed circuit board. In the present embodiment, the shield surface 382 is a metal plate. However, the shield surface 382 may include metal foil or any other material that allows inhibition of electromagnetic radiation to the outside.

A shielding member 383 is attached to a surface of the shield surface 382 of the cover 381 in such a manner as to enclose the perimeter of the option equipment attachment region when the cover 381 is attached. The shielding member 383 serves as a gasket. The shielding member 383 includes urethane with metal foil attached to a surface of the urethane, or the like, and thus has electromagnetic wave shielding capability and elasticity. When the cover 381 is attached to the lower case 12, the shielding member 383 comes into contact with the perimeter of the depression in the lower shield member 34 to electrically close the option equipment attachment portion 30, inhibiting radiation of electromagnetic noise to the outside of the housing.

Figure 8:
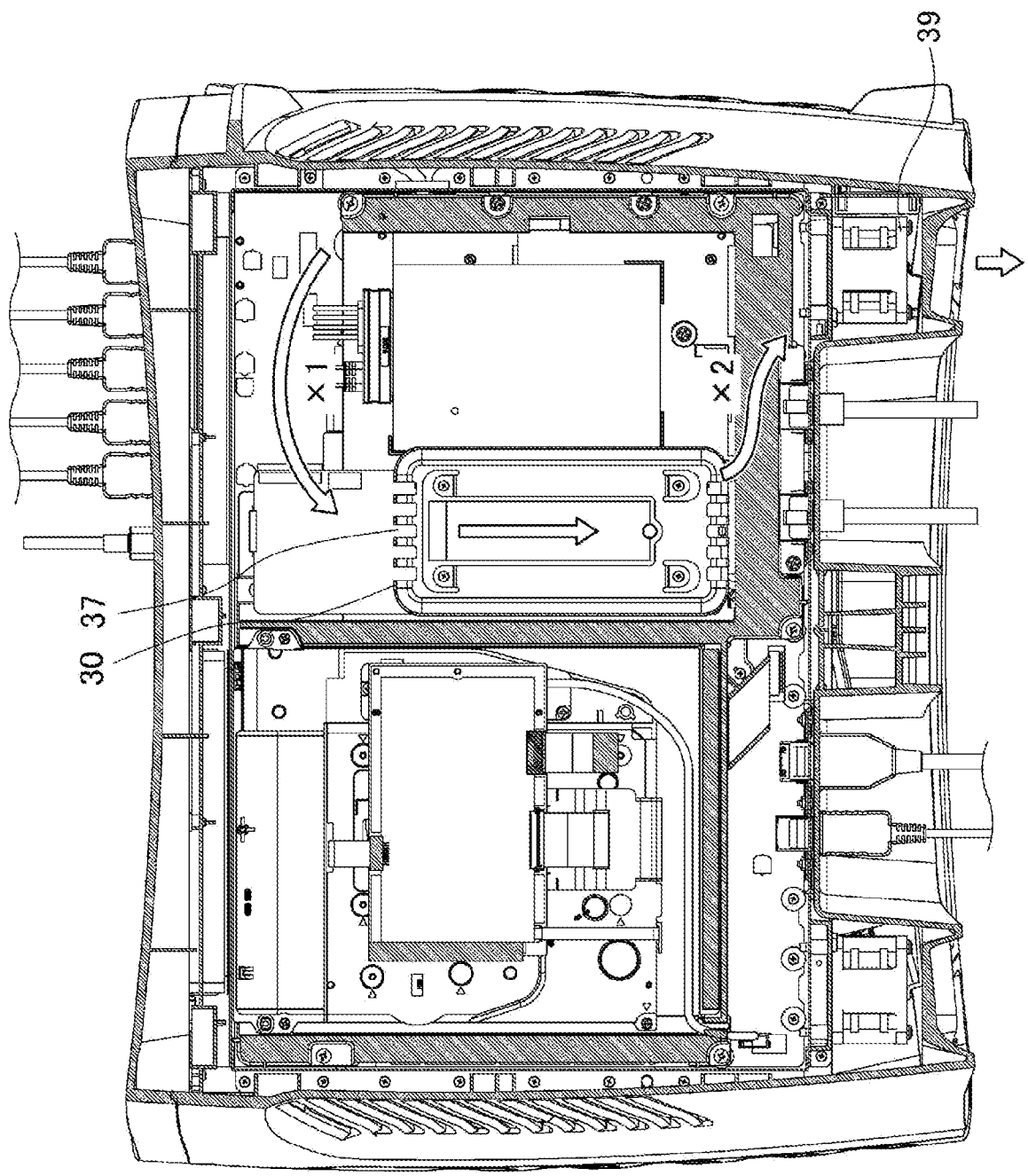
FIG. 8 is a horizontal cross-sectional view of the electronic equipment, in which the upward direction corresponds to the Z2 direction depicted in FIG. 1.

[Fan] The electronic equipment 10 includes a plurality of axial fans one of which is assigned for contribution to cooling of the option equipment. FIG. 8 is a horizontal cross-sectional view of the electronic equipment in which the upward direction corresponds to the Z2 direction depicted in FIG. 1. The left side in the figure corresponds to a front surface of the electronic equipment 10. As depicted in FIG. 8, the fan 39 contributing to cooling of the option equipment is provided on the bottom surface side of the electronic equipment 10 and on a rear surface side of the housing. In FIG. 8, airflows in this case are illustrated by blank arrows. Air is taken from the front surface and the side surfaces of the housing and flows through a pre-stage path x1 and reaches the option equipment attachment portion 30. Then, the air enters the option equipment attachment region via the vent holes 37. The air, which cools the option equipment, passes through a post-path x2 via facing vent holes 37 and is then discharged to the outside by the fan 39.

[In-apparatus Wiring] As depicted in FIG. 5, a support member 41 supporting a separate electronic component is provided on the main printed circuit board 40. A cable 42 to which a display corresponding to external equipment 43 is connected is connected to a connector 400 on the main printed circuit board 40.

Figure 9:
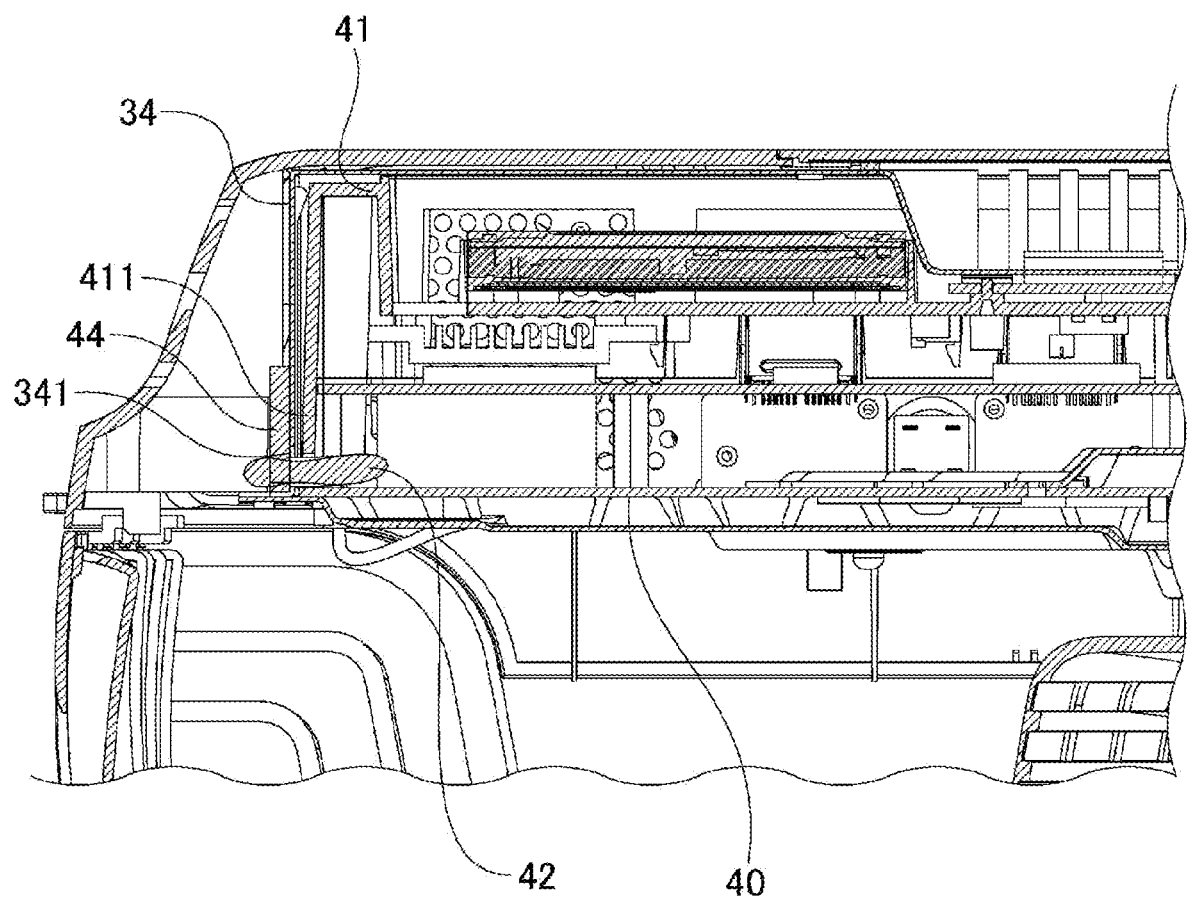
FIG. 9 is an enlarged vertical cross-sectional view of the electronic equipment, in which the upward direction corresponds to the Z2 direction depicted in FIG. 1.

The cable 42 is positioned by the support member 41 inside the housing. FIG. 9 is an enlarged vertical cross-sectional view of the electronic equipment in which the upward direction corresponds to the Z2 direction depicted in FIG. 1. As depicted in FIG. 9, the cable 42 extends from the main printed circuit board 40 and is pushed against the surface of the main printed circuit board 40 by a foot portion 411 of the support member 41. The lower shield member 34 is also overlaid on the surface of the main printed circuit board 40, and an outer side of a side surface of the support member 41 constituting the foot portion 411 of the support member 41 is covered with a side surface of the lower shield member 34. The side surface of the lower shield member 34 is provided with an opening 341. The cable 42 is routed through the opening 341 and out from the lower shield member 34.

As depicted in FIG. 9, a shielding member 44 is attached to the side surface of the lower shield member 34. The shielding member 44 covers the opening 341 to prevent leakage of unwanted radiation from between the cable 42 and the lower shield member 34. The shielding member 44 includes an elastic material such as rubber.

Figure 10:
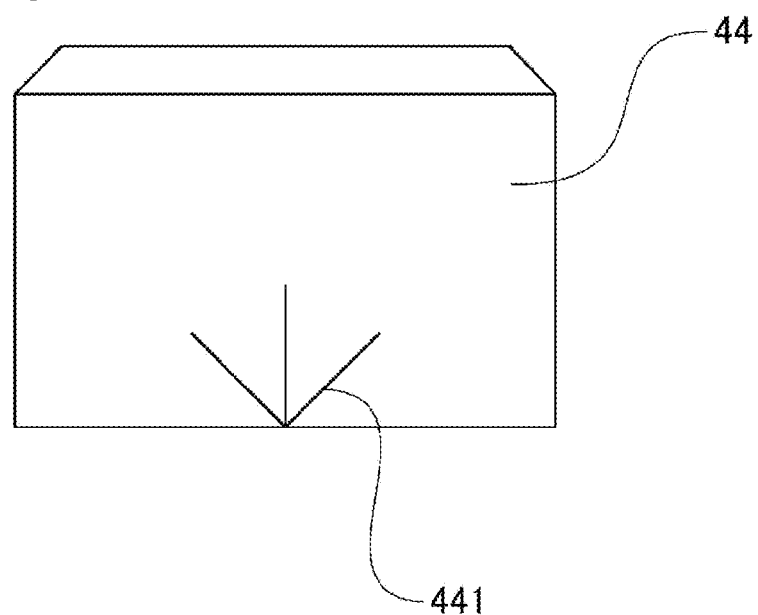
FIG. 10 is a front view of a shielding member according to the present embodiment.

FIG. 10 illustrates the shielding member 44 as viewed from the side surface of the lower shield member 34. As depicted in FIG. 10, a plurality of cuts 441 are formed in a part of the shielding member 44. The cuts 441 are formed radially around a central point of a lower end of the shielding member 44. The cable 42 is threaded through the center of the radial cuts to allow the area between the opening 341 and the cable 42 to be effectively blocked. Note that the shielding member 44 may be provided inside a shield case. Additionally, the cuts 441 are not limited to the shape and the positions illustrated.

Figure 11:
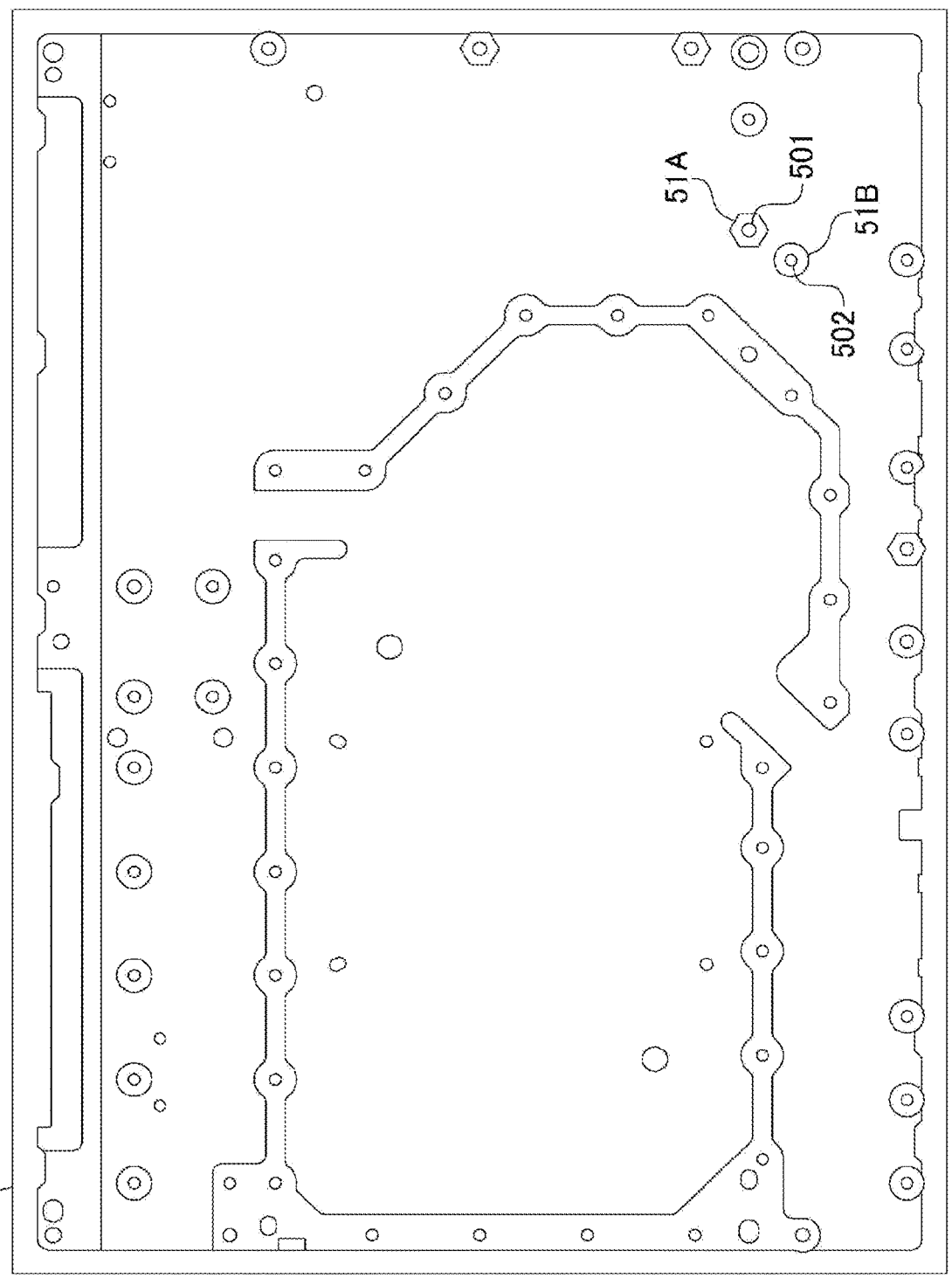
FIG. 11 is a front view of a main printed circuit board according to the present embodiment.

[Land Shape] FIG. 11 is a the main printed circuit board 40 as viewed from the upper surface. Resist treatment is applied to the surfaces of the main printed circuit board 40, and electronic components are mounted on both surfaces of the main printed circuit board 40. The main printed circuit board 40 includes a plurality of through-holes 501 and 502.

Fastening members such as screws and discrete components (not illustrated) such as electrolytic capacitors and transistors are attached into the through-holes 501 and 502 (the fastening members and the discrete components are hereinafter referred to as "components to be mounted"). In a case where the components to be mounted are screws, one through-hole 501 and one through-hole 502 may be formed. For electrolytic capacitors, two holes are formed, and for transistors, three holes are formed. Lands 51A and 51B are provided around the through-holes 501 and 502, and are regions electrically connecting the components to be mounted to the main printed circuit board 40.

The components to be mounted take various forms. In FIG. 11, a component having a hexagonal external shape as viewed from above is assumed to be mounted in the through-hole 501, an upper through-hole in the drawing, and a circular component is assumed to be similarly mounted in the other through-hole 502. Thus, in the present embodiment, a hexagonal land (that is, an electrical connection region; this also applies to the description below) 51A is provided for the hexagonal component, and a circular land 51B is provided for the circular component. These lands can be formed by avoiding applying resist to copper foil for wiring. By providing lands having similar shapes associated with the appearances of components, particularly shapes as viewed from above, that is, planar projective shapes (shapes viewed from the front in an attachment direction), errors can be reduced when the components are manually mounted, and efficiency of programming can be improved even when the components are mounted by image recognition.

In this regard, having "similarity" or "being similar" may include, in addition to a case of belonging to the same type in classification of general figures such as a circle, an ellipse, a triangle, and a rectangle, a case of being the same in the number of vertexes and the angle between sides at the vertex, and the like. Note that the shapes of the through-holes 501 and 502 themselves need not correspond to the shapes of the components to be mounted.

Figure 17:
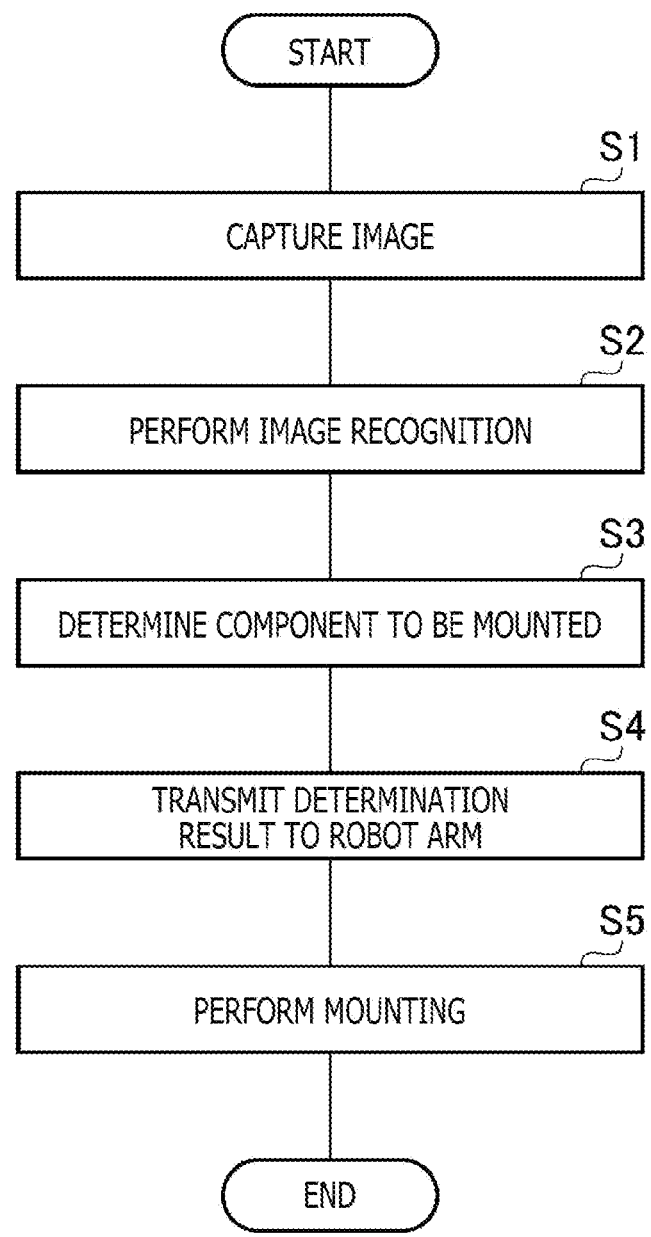
FIG. 17 is a flowchart illustrating processing for automatic mounting in the present embodiment.

[Mounting Steps] FIG. 17 depicts a processing procedure for automatic mounting of the electronic equipment 10 utilizing the lands in FIG. 11. An automatic mounting apparatus (not illustrated) includes a camera, a control section, and a robot for mounting. The control section includes a calculation section such as a CPU, a communication section implementing communication with the camera and the robot, and a storage section storing necessary information. First, the camera is used to capture an image of the main printed circuit board 40 (S1). The captured image is transmitted to the control section, which performs image recognition (S2). Specifically, the control section recognizes the positions of the through-holes 501 and 502 and the shapes of the lands 51A and 51B provided around the through-holes 501 and 502.

Then, the control section, determines, on the basis of the shapes of the lands 51A and 51B, components to be mounted in the through-holes 501 and 502 (components to be mounted) (S3). Thus, the storage section of the control section pre-stores an association table in which identification information regarding components to be mounted is associated with the shapes of the lands. The control section references the association table to acquire identification information regarding the components to be mounted. The control section transmits, to a robot arm, the identification information regarding the determined components to be mounted and information indicative of mounting positions of the components (S4). In accordance with the instruction, the robot arm performs the correct mounting (S5). The above-described processing implements efficient automatic mounting. Note that the control section may be provided inside the automatic mounting apparatus or may operate in a server on the Internet.

[Printed Circuit Board Lower Surface] An electromagnetic shield structure of the main printed circuit board 40 will be described.

As depicted in FIG. 5, a shield member 60 covers all of a plurality of electronic components mounted on one surface of the main printed circuit board 40 to prevent (inhibit) electromagnetic radiation from the electronic components. The shield member 60 is provided with no hole except a hole for fixing the shield member 60 to the main printed circuit board 40. This structure enables a further reduction in electromagnetic noise from the electronic components inside the shield.

Figure 12:
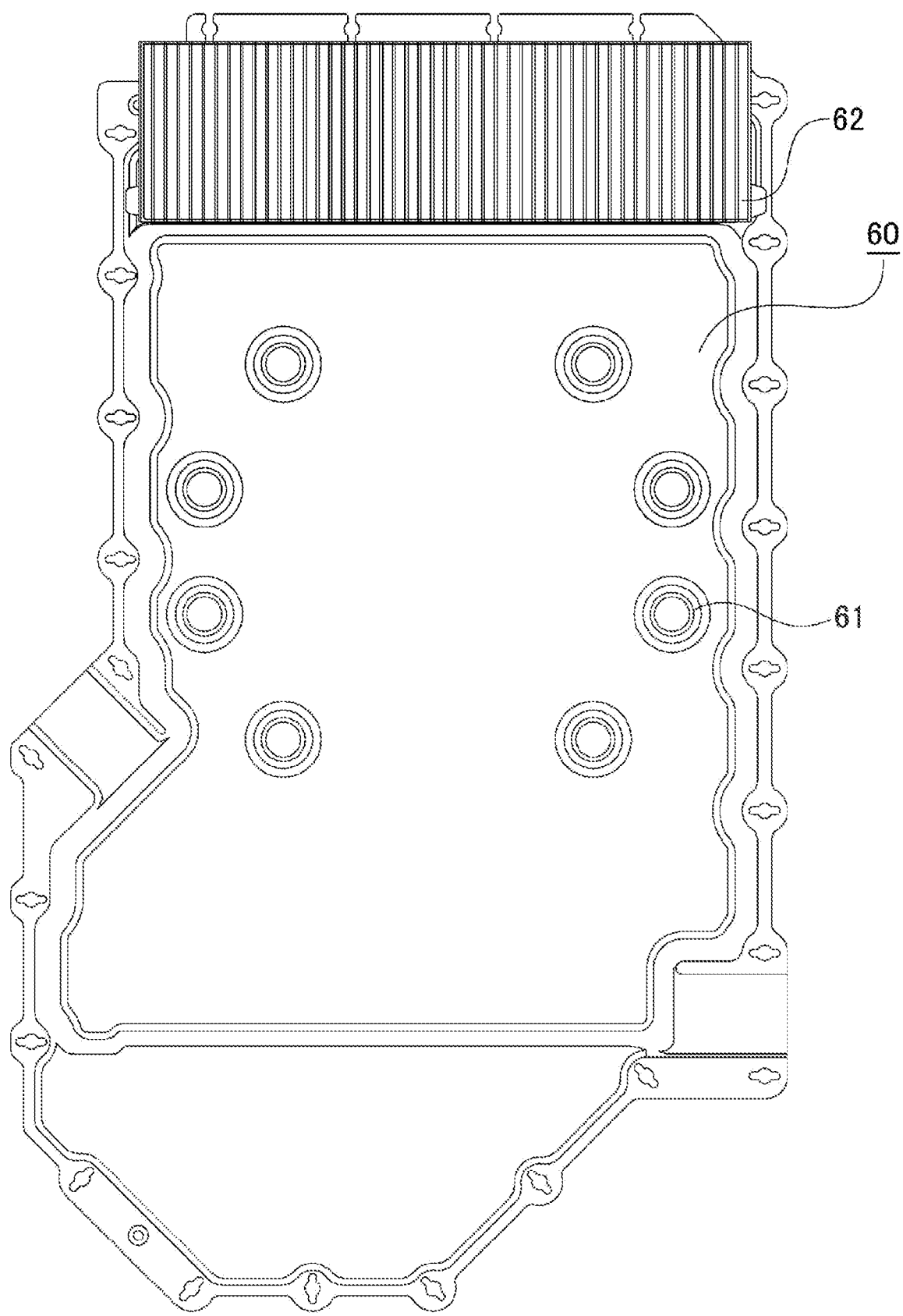
FIG. 12 is a front view of a shield member according to the present embodiment.

FIG. 12 is a front view of the shield member. As depicted in FIG. 12 and FIG. 13, the shield member 60 is provided with edge portions that are in contact with one surface of the main printed circuit board 40 and a lower surface forming a housing space that protrudes from the edge portions in a direction away from the one surface of the main printed circuit board 40 and that covers all of the plurality of electronic components on the main printed circuit board. The lower surface is provided with a plurality of recess portions 61. The recess portions 61 are formed at positions corresponding to the electronic components on the printed circuit board in such a manner as to avoid the components. In other words, the recess portions 61 are formed such that, with the shield member 60 attached to the printed circuit board, a bottom portion of the shield member 60 contacts at least a part of each of the electronic components on the printed circuit board. This structure places the electronic components closer to the shield member 60 to make the electronic components likely to thermally contact the shield member 60. Note that the shape and size of the recess portions 61 are not limited and may vary according to the positions by being selected as appropriate depending on the corresponding electronic components.

A thermal interface material (TIM) is applied to the surfaces of the plurality of electronic components disposed on the main printed circuit board (not illustrated in FIG. 12). The shield member 60 and the plurality of electronic components are thermally connected together via the TIM. Thus, heat from the plurality of electronic components is transmitted to the shield member 60, which functions as a heat dissipating plate. In this case, the electronic equipment 10 may be further provided with at least any one of mechanisms for cooling the shield member 60, such as a fan, a vent hole, and a heat sink.

As an example, a heat sink 62 is provided on at least a part of a surface of the shield member 60 opposite to a surface covering the electronic components (electronic component-side surface), for example, at the edge of the shield member 60, such that the heat sink 62 thermally contacts the shield member 60. With the shield member 60 attached to the printed circuit board, the heat sink 62 is provided at a position where the heat sink 62 covers a power element or a high-speed element that consumes high power, to thermally connect to the element. Thus, heat from each element is efficiently transmitted to the shield member 60. Note that the position and area of the heat sink 73 with respect to the shield member 60 are not limited.

[Printed Circuit Board Upper Surface] The above-described shield member 60 covers a lower surface of the main printed circuit board 40 when the electronic equipment 10 is placed as depicted in FIG. 1. On the other hand, a plurality of electronic components are disposed on an upper surface of the main printed circuit board 40, and thus, a shield is provided covering the electronic components as described above. FIG. 13 is a cross-sectional view of the main printed circuit board to which the shield is attached. The electronic components disposed on the upper surface of the main printed circuit board 40 include an integrated circuit 70 such as a CPU operating at high speed. A first shield 71A covers the integrated circuit 70. An opening 72A is provided in the first shield 71A, and the heat sink 73 contacts the integrated circuit 70 via the opening.

The second shield 71B covers the first shield 71A and a plurality of other electronic components. The second shield 71B is provided overlapping the first shield 71A. Note that, for easy understanding, in FIG. 13, spacing is provided between the heat sink 73, the first shield 71A, and the second shield 71B. In actuality, the heat sink 73, the first shield 71A, and the second shield 71B are fixed with no spacing between them.

The second shield 71B is also provided with an opening 72B through which the heat sink 73 contacts the integrated circuit 70. The opening 72B in the second shield 71B is provided overlapping the opening 72A in the first shield 71A. A protruding portion 731 is provided on a bottom surface of the heat sink 73 and is fitted into an opening portion formed by the openings 72A and 72B, to thermally connect the integrated circuit 70 to the heat sink 73. Note that, when the two shields are overlaid on each other, edges of the openings 72A and 72B in the shields need not align with each other. The structure may be such that, even with the edges misaligned with each other, the heat sink 73 can be thermally connected to the integrated circuit 70. The openings 72A and 72B may vary in size.

A shielding member 74A is disposed between the first shield 71A and the second shield 71B and between the first shield 71A and the heat sink 73. The shielding member 74A includes an elastic material such as rubber or urethane with metal foil attached to a surface of the material, and thus has conductivity and flexibility. The shielding member 74A serves to fill the gap between the first shield 71A and the opening portion formed by the openings 72A and 72B. Specifically, the shielding member 74A fills the gap between the first shield 71A and the second shield 71B and the gap between the first shield 71A and the heat sink 73. Thus, the shielding member 74A can be replaced with a "conductive first connection member." This structure prevents electromagnetic noise generated by the electronic component in the first shield 71A from leaking from between the first shield 71A and the second shield 71B or from between the first shield 71A and the heat sink 73. The shielding member 74A may be provided in simultaneous contact with the first shield 71A, the second shield 71B, and the heat sink 73 at predetermined positions.

Similarly, a shielding member 74B having conductivity and flexibility is also disposed between the second shield 71B and a bottom portion 732 of the heat sink 73. In other words, the shielding member 74B serves to fill the gap between the second shield 71B and the opening portion formed by the openings 72A and 72B. Specifically, the shielding member 74B fills the gap between the second shield 71B and the heat sink 73. Thus, the shielding member 74B can be replaced with a "conductive second connection member." This prevents electromagnetic noise generated by the electronic components inside the first shield 71A and the second shield 71B from leaking from between the second shield 71B and the heat sink 73.

As described above, the perimeter of the integrated circuit 70, operating at high speed, is covered with the two shields, the heat sink penetrates the two shields, and the shielding member (connection member) having elasticity and conductivity fills the gap between the shield and the heat sink. Thus, even in an environment in which high-frequency noise occurs, a sufficient electromagnetic radiation prevention effect can be easily produced. Additionally, the heat sink 73 is placed on the shield without any gap, and thus, the heat sink 73 itself also serves as a shield. [Light Guide Path] As depicted in FIG. 1, the electronic equipment 10 includes a light emission region 80 in the front surface of the electronic equipment 10. The light emission region 80 includes a plurality of indicators 81 to notice a user of an operating state of the electronic equipment 10 through a light emission pattern.

Figure 15:
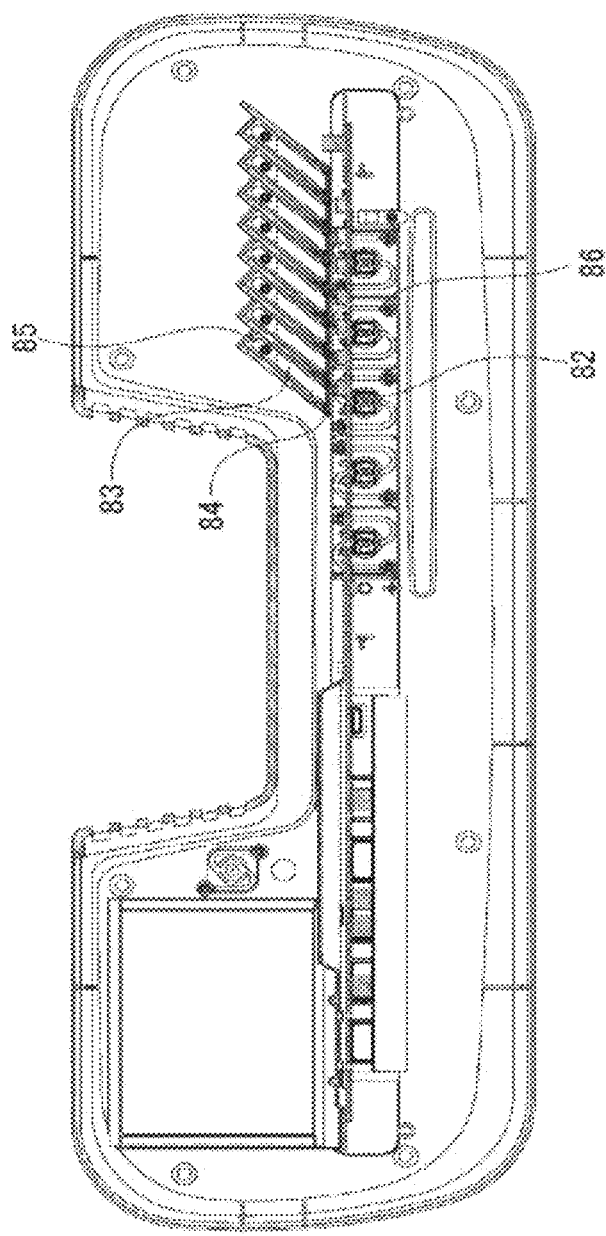
FIG. 15 is a cross-sectional view of the electronic equipment of the present embodiment, in which a light emission region is viewed in a Y2 direction.

FIG. 15 is a cross-sectional view of the electronic equipment in which the light emission region is seen in the Y2 direction. In other words, FIG. 15 depicts the internal structure of the light emission region 80. The light emission region 80 includes a plurality of LEDs (Light-emitting Diodes) 82 mounted on the circuit board and a plurality of light guiding members 83. Each of the plurality of light guiding members 83 includes a bottom surface 84 and an emission surface 85, and the bottom surfaces 84 of the plurality of light guiding members 83 are each disposed facing a plurality of LEDs 82. This structure can guide light from the LEDs to the respective emission surfaces 85.

Light shielding members 86 are each disposed between the plurality of LEDs 82. Each of the light shielding members 86 prevents light from the LED adjacent to the light shielding member 86 from entering the light guiding member 83. This structure prevents mixture of light from adjacent LEDs leading to an ambiguous light emission pattern of the indicators 81.

Figure 16:
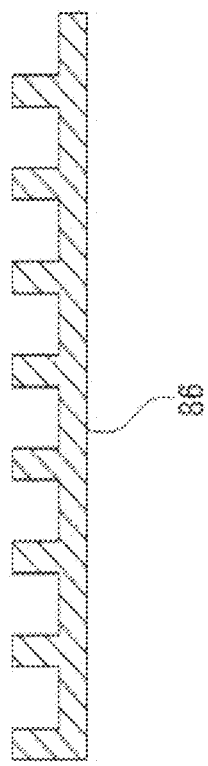
FIG. 16 is a diagram depicting a light shielding member for the light emission region in the present embodiment.

FIG. 16 is a diagram depicting the shape of the light shielding member 86. In this example, the light shielding member 86 has a comb tooth shape integrally formed by a plurality of partitioning walls to be disposed between the LEDs 82 and a shaft supporting the partitioning walls at appropriate intervals. This structure allows easier assembly than a structure with one light shielding member provided between the adjacent LEDs. Additionally, when the light shielding member 86 is manufactured, a material plate is cut into a shape in which comb teeth of one comb mesh with comb teeth of another comb. Then, the gaps between the comb teeth of one comb can be used as comb teeth of another comb, enabling a reduction in material loss.

An embodiment has been described above. Modified techniques will be described below. The shielding member 44 in FIG. 10 is provided with the radial cuts 441. However, the present invention is not limited to this, and any shape may be used that can reduce gaps resulting from threading of the cable 42. For example, instead of the cuts 441, holes each with a diameter equivalent to or slightly smaller than the diameter of the cable 42 may be formed. Alternatively, depending on the material of the shielding member 44, the deformability of the shielding member 44 may be utilized to thread the cable 42 between the shielding member 44 and the main printed circuit board 40 without providing cuts or holes.

The shielding members appearing at portions of the embodiment may be formed by mixing, instead of attaching metal foil to the surface of an elastic material, a metal compound or a metal filler into such a material. Additionally, the shielding members may each be made of a metal component having a shape compatible with a corresponding structural portion and include a rubber base attached to a rear surface of the component.

INDUSTRIAL APPLICABILITY

As described above, the present invention can be utilized for a game machine, a development machine for executing various programs being developed (for example, game programs), and an information processing apparatus other than the game machines (for example, server apparatus).

REFERENCE SIGNS LIST

10: Electronic equipment
12: Lower case
111: Main body cover
112: Side cover
113: Exhaust port
20: Antenna substrate attachment portion
30: Option equipment attachment portion
31: Option printed circuit board
34: Lower shield member
341: Opening
35: Wall
37: Vent hole
38: Opening
381: Cover
382: Shield surface
383: Shielding member
39: Fan
40: Main printed circuit board
44, 74A, 74B: Shielding member
441: Cut
73: Heat sink
501, 502: Through-hole
51A, 51B: Land
60: Shield member
62, 73: Heat sink
70: Integrated circuit
71A: First shield
71B: Second shield
80: Light emission region
80, 81: Indicator
82: LED
86: Light shielding member

The invention claimed is:

1. A printed circuit board comprising:
through-holes into which one or more electrical leads of a plurality of types of respective components are to be attached by inserting such one or more electrical leads, which extend from respective bodies of such respective components, through the through holes; and
a respective electrically conductive region located around each of the through-holes to electrically connect the one or more electrical leads of the respective components to the printed circuit board,
wherein a respective shape of the electrically conductive region corresponds to an appearance of a given one of the respective bodies, not the one or more electrical leads, of a given one of the respective components.

2. The printed circuit board according to claim 1, wherein the respective shape of the electrically conductive region is similar to a shape of the given one of the respective bodies, not the one or more electrical leads, of the given one of the respective components attached to the corresponding through-hole as viewed from a front in an attachment direction.

3. A method for manufacturing electronic equipment including a printed circuit board, the printed circuit board comprising:
through-holes into which one or more electrical leads of a plurality of types of respective components are to be attached by inserting such one or more electrical leads, which extend from respective bodies of such respective components, through the through holes; and
a respective electrically conductive region located around each of the through-holes to electrically connect the one or more electrical leads of the respective components to the printed circuit board,
wherein a respective shape of the electrically conductive region corresponds to an appearance of a given one of the respective bodies, not the one or more electrical leads, of a given one of the respective components, the method comprising:
capturing an image of the printed circuit board using a camera;

recognizing a shape of an electrical connection region in the captured image;
determining, from the shape of the electrical connection region, a component among the respective components to be mounted; and
mounting the determined component.

\* \* \* \* \*